(12) United States Patent
Sample

(10) Patent No.: US 12,726,122 B2
(45) Date of Patent: Sep. 1, 2026

(54) SYSTEM AND COMPONENT FOR POWER CONVERSION

(71) Applicant: The USA as Represented by the Sec of the Navy, San Diego, CA (US)

(72) Inventor: Dwane F. Sample, San Diego, CA (US)

(73) Assignee: United States of America as represented by the Secretary of the Navy, Washington, DC (US)

( * ) Notice: Subject to any disclaimer, the term of this patent is extended or adjusted under 35 U.S.C. 154(b) by 140 days.

(21) Appl. No.: 18/733,082

(22) Filed: Jun. 4, 2024

(65) Prior Publication Data

US 2025/0373160 A1 Dec. 4, 2025

(51) Int. Cl.
*H02M 3/158* (2006.01)
*H03K 17/615* (2006.01)

(52) U.S. Cl.
CPC .......... *H02M 3/158* (2013.01); *H03K 17/615* (2013.01)

(58) Field of Classification Search
CPC .................................................... H02M 3/158
USPC ......................................................... 327/540
See application file for complete search history.

(56) References Cited

U.S. PATENT DOCUMENTS 7,280,332 B2 * 10/2007 Ma ...................... H10D 89/611 361/91.1
2018/0342944 A1 * 11/2018 Chiereghin ........... H02M 3/156

* cited by examiner

*Primary Examiner* — Tomi Skibinski
(74) *Attorney, Agent, or Firm* — Naval Information Warfare Center Pacific; Evan Hastings; Kyle Eppele

(57) ABSTRACT

The multiple embodiments of the present invention relate to an electronic component comprising a first bipolar junction transistor having a first base, a first collector and a first emitter, a second bipolar junction transistor having a second base receiving the current flow of the first emitter, a second collector electrically coupled to the first collector and a second emitter and a load interface for electrically coupling the electronic component in parallel to a load and shunting current away from the load.

9 Claims, 6 Drawing Sheets

SYSTEM AND COMPONENT FOR POWER CONVERSION

FEDERALLY-SPONSORED RESEARCH AND DEVELOPMENT

The United States Government has ownership rights in the invention claimed herein. Licensing and technical inquiries may be directed to the Office of Research and Technical Applications, Naval Information Warfare Center Pacific, Code 72120, San Diego, CA, 92152; voice (619) 553-5118; NIWC_Pacific_T2@us.navy.mil. Reference Navy Case Number 210284.

BACKGROUND OF THE INVENTION

Designing systems and components to transfer power over long distances take into account cost, efficiency, size and accessibility as well as takes into consideration providing the desired power needs where the power is used. Accessibility provides opportunities for maintenance and repair such that the use of transformers and alternating current have an economical advantage for transferring power. Where accessibility is low for transferring power through terrain such as underwater, underground or mountainous terrain, different design considerations may arise including complexity of design and the size of a module.

In an electrical circuit having a load, it may be desirous to control the voltage on the load by shunting a portion of the current away from the load.

SUMMARY

In an embodiment, the present invention relates to an electronic component comprising a first bipolar junction transistor having a first base, a first collector and a first emitter, a second bipolar junction transistor having a second base receiving the current flow of the first emitter, a second collector electrically coupled to the first collector and a second emitter; and a load interface for electrically coupling the electronic component in parallel to a load.

In another embodiment, the present invention relates to an electrical system comprising a voltage source, an electronic component comprising a first bipolar junction transistor having a first base, a first collector and a first emitter and a second bipolar junction transistor having a second base receiving the current flow of the first emitter, a second collector electrically coupled to the first collector and a second emitter; and a load electrically coupled in parallel with the electronic component.

A method of shunting current in an electrical system comprising receiving electrical current from a voltage source to a junction; shunting a portion of the electrical current from the junction toward a base of a first bipolar junction transistor; shunting electrical current from the junction away from a load coupled in parallel to the first bipolar junction transistor; and directing current from an emitter of the first bipolar junction transistor to the base of a second bipolar junction transistor.

BRIEF DESCRIPTION OF THE DRAWINGS

Throughout the several views, like elements are referenced using like references. The elements in the FIGS. are not drawn to scale and some dimensions are exaggerated for clarity.

DETAILED DESCRIPTION OF EMBODIMENTS

The disclosed methods and systems below may be described generally, as well as in terms of specific examples and/or specific embodiments. For instances where references are made to detailed examples and/or embodiments, it should be appreciated that any of the underlying principles described are not to be limited to a single embodiment, but may be expanded for use with any of the other methods and systems described herein as will be understood by one of ordinary skill in the art unless otherwise stated specifically. Additionally, the terminology used herein is for the purpose of description and not of limitation. Furthermore, although certain methods are described with reference to steps that are presented herein in a certain order, in many instances, these steps may be performed in any order as may be appreciated by one skilled in the art; the novel method is therefore not limited to the particular arrangement of steps disclosed herein.

It must be noted that as used herein and in the appended claims, the singular forms "a", "an", and "the" include plural references unless the context clearly dictates otherwise. Furthermore, the terms "a" (or "an"), "one or more" and "at least one" can be used interchangeably herein. The terms "comprising", "including", "having" and "constructed from" can also be used interchangeably.

Figure 1:
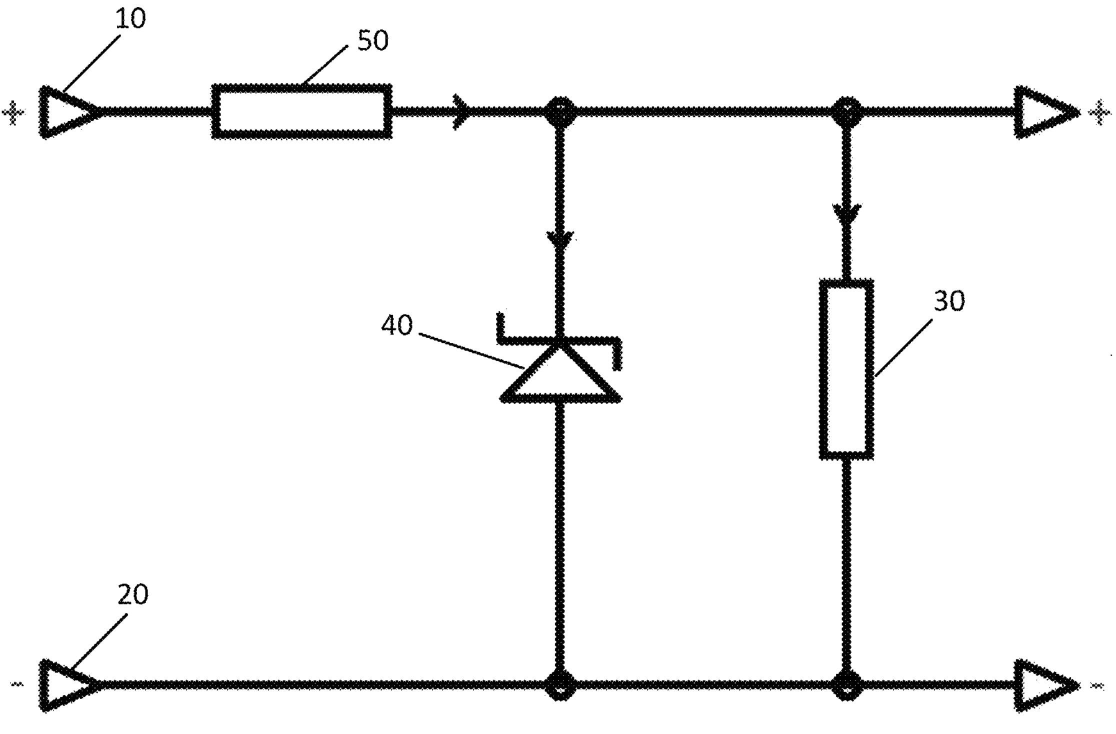
FIG. 1 is a schematic of an environment of which one or more embodiments of the present disclosure relates.

FIG. 1 illustrates an environment where one or more of the embodiments of the described inventions below exists within, incorporates, is a part of or relates. FIG. 1 illustrates a voltage source 10, a ground 20 and a load 30. A diode 40 is located in parallel to the load 30 and shunts current away from the load. A resistance 50 may lie between the voltage source 10 and the load 30 or diode 40. Resistance 50 may represent the parasitic resistance of a cable which transfers power from voltage source 10 to load 30.

Figure 2:
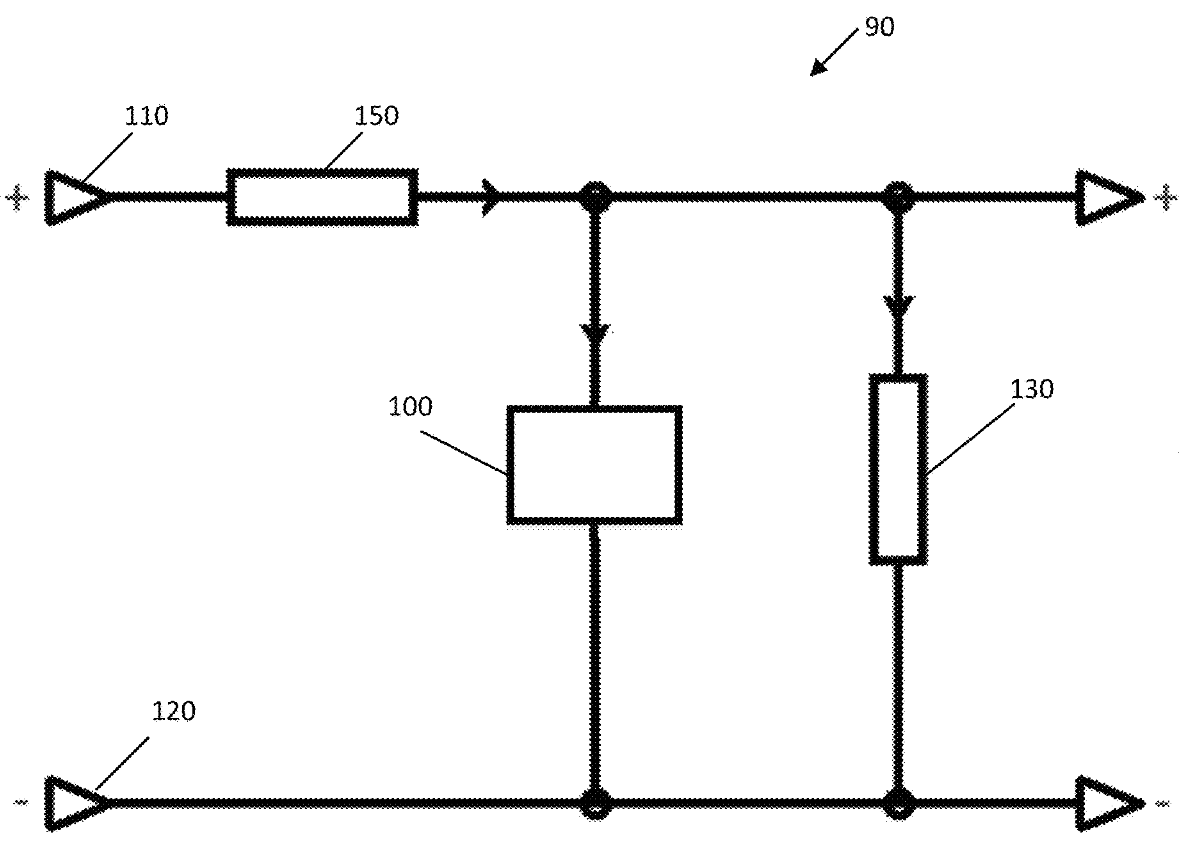
FIG. 2 is a schematic of an electrical system, according to an embodiment of the present disclosure.

Referring to FIG. 2, in an embodiment, an electrical system is shown, having a voltage source 110, a ground 120, a load 130 and an electrical component or shunting component 100 in parallel with the load. When the voltage source 110 applies a voltage, the shunting component 100 diverts current from the load 130 resulting in a drop in voltage experienced by the load. In an embodiment, shunting component 100 varies the amount of current shunted in response to the amount of current being used by load 130 such that any excess current is shunted. In an embodiment, the shunting component 100 is located proximate to the load 130, for example, is integrated within the same housing, or is a separate module within a hundred feet to create a local power extraction point along a power distribution network. In an embodiment, the voltage across the shunting component 100 is greater than or equal to 12 volts DC. In another embodiment, the voltage across the shunting component 100 is greater than or equal to 24 volts DC. In another embodiment, the voltage across the shunting component 100 is greater than or equal to 120 volts DC. In another embodiment, the voltage across the shunting component 100 is greater than or equal to 240 volts DC. The current supplied by the voltage source 110 may be generally constant current. In an embodiment, the voltage provided by the voltage source 110 is greater than or equal to 150 kV DC or AC. In another embodiment, the voltage provided by the voltage source 110 is greater than or equal to 300 kV DC or AC. A resistance 150 of the cable or transmission line between the voltage source 110 and the load 130 or shunting component 100 may have a resistance of 0.0015 ohm/1000 ft or greater. The voltage stepped down by the electronic component may be greater than or equal to five hundred volts.

Figure 3:
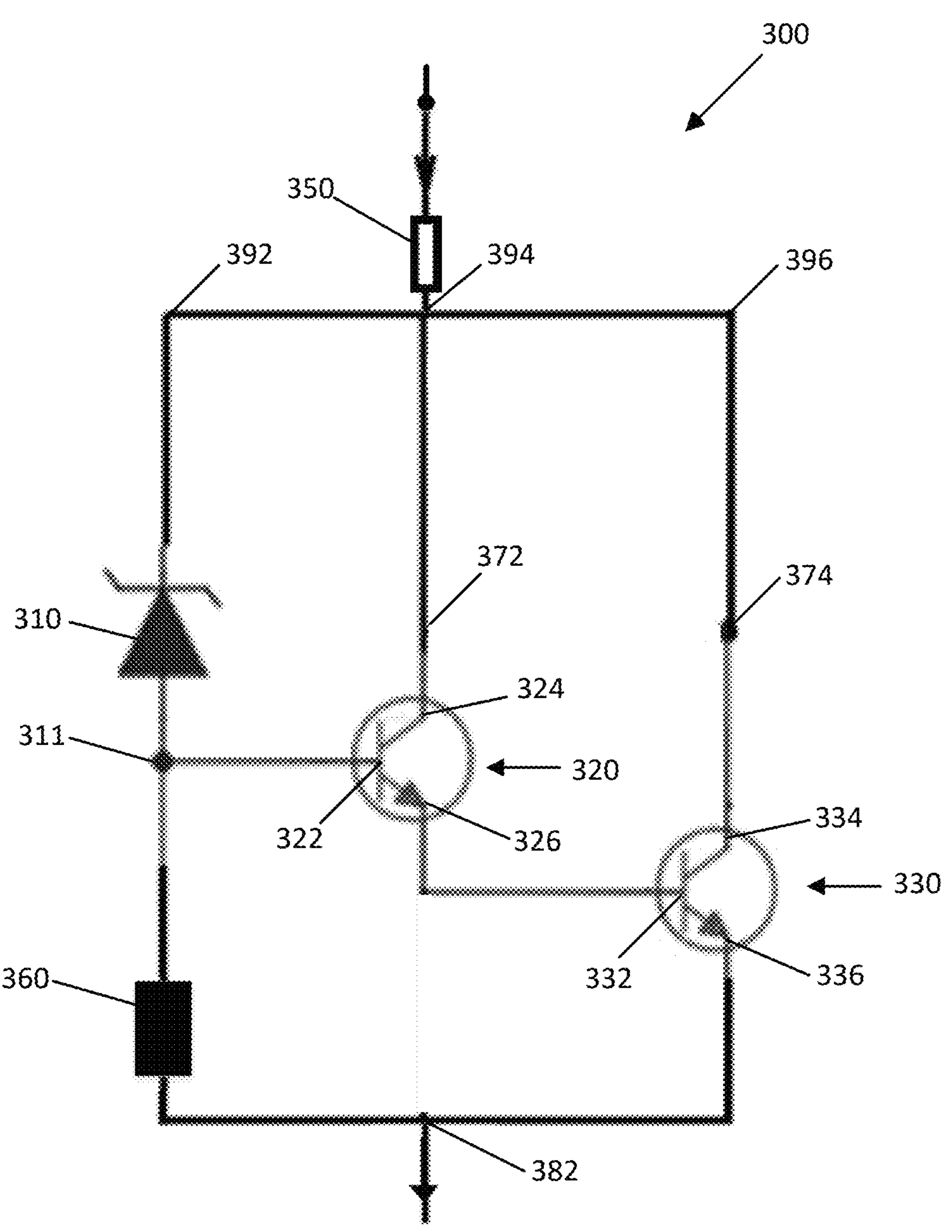
FIG. 3 is a schematic of an electrical shunting component according to an embodiment of the present disclosure.

FIG. 3 illustrates an embodiment of the shunting component where the shunting component 300 is an electronic component that comprises a diode 310, a first bipolar junction transistor 320 having a first base 322, a first collector 324 and a first emitter 326, a second bipolar junction transistor 330 having a second base 332 receiving the current flow from the first emitter, a second collector 334 electrically coupled to the first collector and a second emitter 336, and a load interface 394 for electrically coupling the shunting component in parallel to a load. A junction 311 lies downstream of diode 310 and upstream of first base 322, lying between diode 310 and first base 322. In an embodiment, the first collector 324 and the second collector 334 receive current from node 372 and 374, respectively. The first emitter 326 and the second emitter 336 may direct flow to a common node 382. Diode 310 may also direct flow to common node 382. When flow is shunted through first collector 324, the current flow through first emitter 326 may be greater than through diode 310. In an embodiment, when flow is shunted through first collector 324, the current flow through second emitter 336 may be greater than through diode 310.

In an embodiment, a load is connected in parallel to the shunting component 300 whereby current may be shunted away from the load. The voltage across the shunting component 300 may be in the range of 12 to 24 volts. In another embodiment, the voltage across the shunting component 300 may be in the range of 120 to 240 volts. In another embodiment, the voltage across the shunting component 300 may be in the range of 24 to 120 volts. In an embodiment, the diode 310 is a zener diode that may be upstream of the first bipolar junction 320 and may be reverse biased. The electronic circuit 300 may further comprise a resistance 350 upstream of shunting component 300. Resistance 350 represents the collective resistance of the power transmission cable that carries the current from a voltage source to shunting component 300. Element 360 is a biasing element that can comprise a diode. Element 360 restricts current flow from node 382 to node 311. A seawater return may provide a ground for the load or the electrical component 300.

Figure 4:
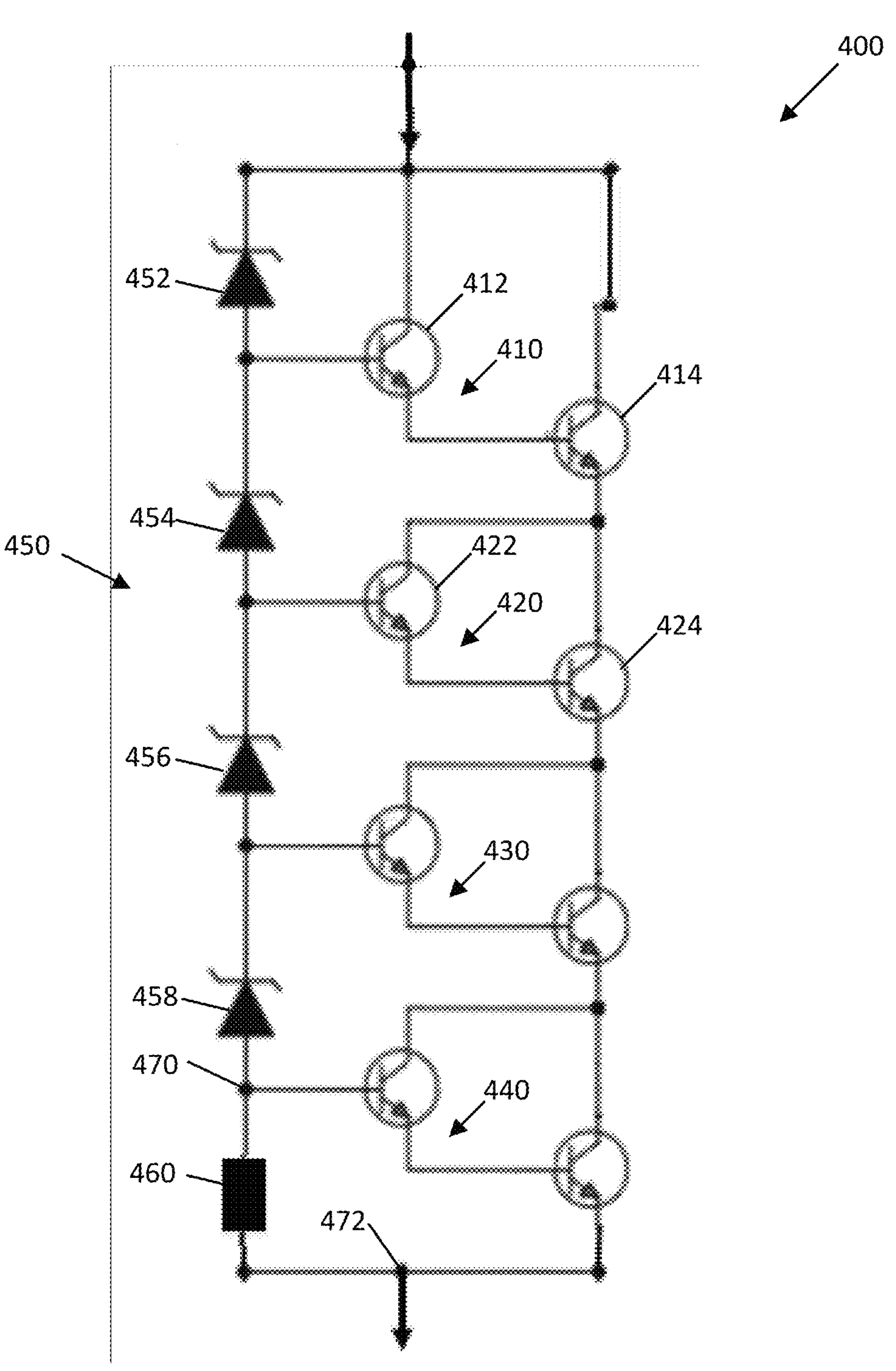
FIG. 4 is a schematic of an electrical shunting component according to another embodiment of the present disclosure.

FIG. 4 illustrates an embodiment of an electronic component in the form of a shunting component 400 that comprises a first bipolar junction transistor 412 and a second bipolar junction transistor 414 that collectively form a first Darlington pair 410, and a second Darlington 420 pair which includes a third bipolar junction transistor 422 and a fourth bipolar junction transistor 424, that lies downstream of the first Darlington pair 410. In an embodiment, additional or a plurality of Darlington pairs 430 and 440, each lie downstream of the first Darlington pair. While four Darlington pairs 410, 420, 430, 440 are shown, more than four Darlington pairs may be used.

In embodiment, the electronic component or shunting component 400 may comprise a set of diodes 450 that comprise a first diode 452 and a plurality of diodes 454, 456, 458 in series with the first diode. The diodes 452, 454, 456, 458 may lie upstream to each of corresponding Darlington pairs 410, 420, 430, 440. For example, diode 452 lies upstream of Darlington pair 410. Diode 454 lies upstream of Darlington pair 420. Diode 456 lies upstream of Darlington pair 430. Diode 458 lies upstream of Darlington pair 440.

In an embodiment, the number of Darlington pairs that are in series is determined by a voltage target or voltage target range that is desired to be applied to the load that is in parallel with the electronic component 400. The voltage from the voltage source is also taken into account and the on-design or maximum voltage rating of each of the Darlington pairs. The load voltage of electronic component 400 may be determined using the formula $V_{EC}=nV_z+2nV_{BE}$ where $V_{EC}$ is the voltage across the load voltage of electronic component 400, $V_z$ is the voltage across an individual diode 452, 454, 456, 458 and $V_{BE}$ is voltage across an individual Darlington pair 410, 420, 430, 440.

Each Darlington pair may have an on-design or maximum voltage rating or an on-design or maximum current rating. In combination, multiple Darlington pairs arranged in series can achieve the voltage target or voltage target range that is lower than the input voltage. For example, referring to FIG. 2 and FIG. 3 a voltage source 110 may supply a voltage at 75 volts or above. The Darlington pair comprising first bipolar junction transistor 320 and second bipolar junction transistor 330 may have an on-design or maximum voltage drop of 50 volts. Darlington pair 320, 330 provide a variable resistance allowing the Darlington pair 320, 330 to increase or decrease the amount of current shunted. The Darlington pair 320, 330 in combination with diode 310 would have a current rating that would meet or exceed the needed shunting of current to maintain the on-design or maximum voltage of 50 volts. For example, if the load has a 50 ohm resistance then Darlington pair 320, 330 in combination with diode 310, having a current rating of at least 2 amperes, would be more than sufficient to shunt any unused current by the load and which would allow electronic component 300 to regulate variances in current for the load while keeping the voltage at or about 50 volts for the load. In an embodiment, the voltage source produces a generally constant current.

Referring to FIG. 4, in an embodiment, each of Darlington pairs 410, 420, 430, 440, in this example, also have a fifty volt on-design or maximum voltage rating. As Darlington pairs 410, 420, 430, 440 are arranged in series, a voltage source can provide voltage at or about two hundred and forty volts. The cumulative voltage drop capability of Darlington pairs 410, 420, 430, 440 added together with diodes 452, 454, 456, 458 can be determined by the formula $V_{EC}=nV_z+2nV_{BE}$. The combination of diodes 452, 454, 456, 458 and Darlington pairs 410, 420, 430, 440 are cable of shunting a sufficient amount of current to maintain a generally constant voltage across electrical component 400 and to a load in parallel with electrical component 400. Each of Darlington pairs 410, 420, 430, 440 have a variable resistance that in series and in combination with diodes 452, 454, 456, 458 are able to vary the current shunted to create a sufficient voltage drop to provide a desired voltage to the load. Element 460 is a biasing element that can comprise a diode. Element 460 restricts current flow from node 472 to node 470. A seawater return may provide a ground for the load or the electrical component 400.

As the need for shunting increases or decreases, each of Darlington pairs' 410, 420, 430, 440 will adjust their resistance to increase or decrease their shunting capacity. For example, if the load has a 240 ohm resistance then the combination of diodes 452, 454, 456, 458 and Darlington pairs 410, 420, 430, 440 collectively have a current rating of at least 1 amperes. The combination would be more than sufficient to shunt any unused current by the load and would allow electronic component 400 to regulate variances in current for the load while keeping the voltage at or about 240 volts for the load. In an embodiment, the voltage source produces a generally constant current.

Figure 5:
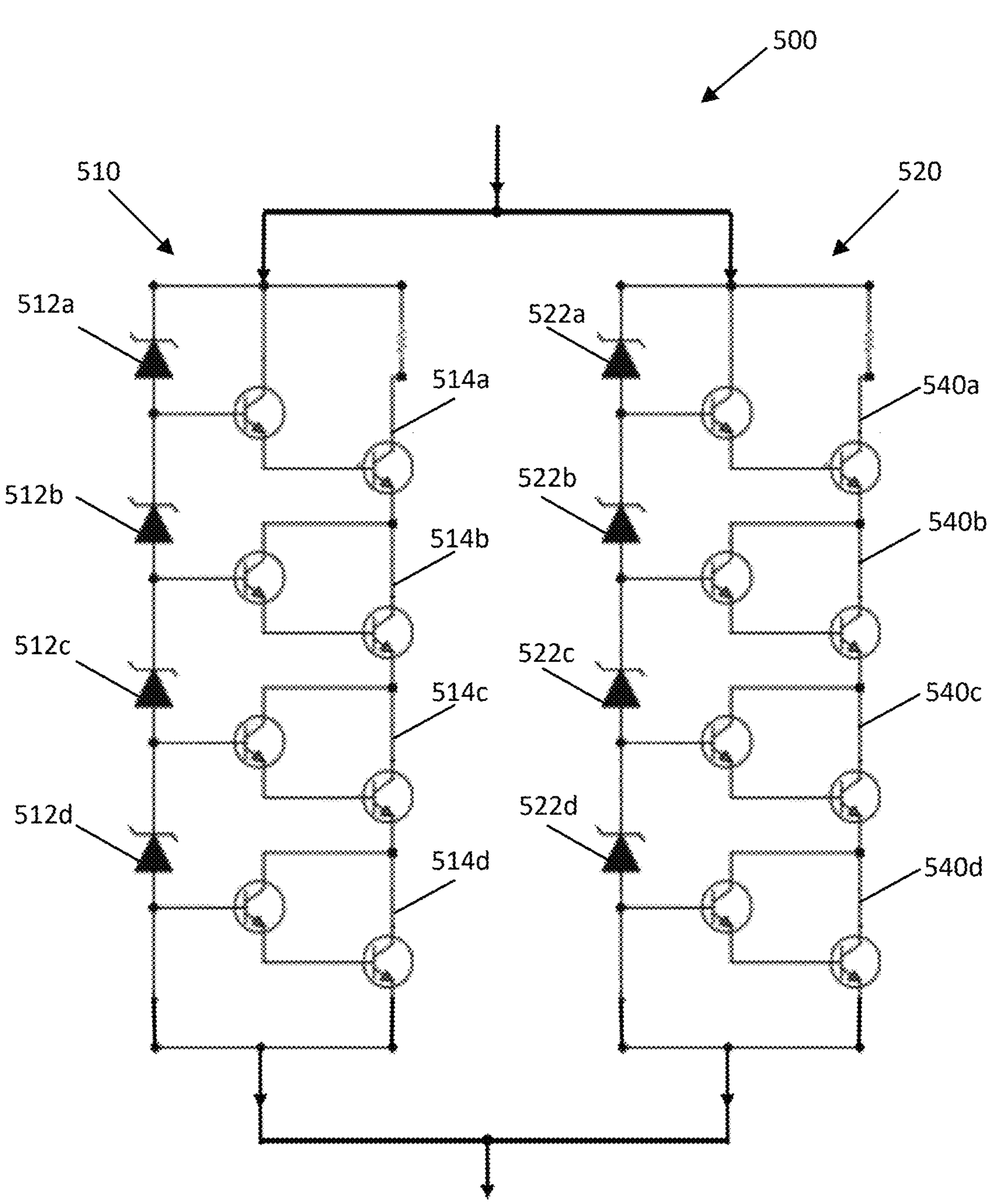
FIG. 5 is a schematic of an electrical shunting component according to another embodiment of the present disclosure.

FIG. 5 illustrates an embodiment of an electronic component that comprises a first module 510 which includes a first set of diodes 512*a*, 512*b*, 512*c*, 512*d* and a first set of Darlington pairs 514*a*, 514*b*, 514*c*, 514*d* and a second module 520 comprising a second set of diodes 522*a*, 522*b*, 522*c*, 522*d*, the second set of diodes comprising at least one diode 522*a* in series with a plurality of diodes 522*b*, 522*c*, 522*d*. The second set of diodes 522*a*, 522*b*, 522*c*, 522*d* are in parallel with the first set of zener diodes 512*a*, 512*b*, 512*c*, 512*d*. In an embodiment, the second module 520 comprises a plurality of Darlington pairs 540*a*, 540*b*, 540*c*, 540*d* coupled correspondingly downstream respectively to at least one of diodes 522*a*, 522*b*, 522*c*, 522*d* in second module 520. For example, Darlington pair 540*a* is downstream of diode 522*a*, Darlington pair 540*b* is downstream of diode 522*b*, Darlington pair 540*c* is downstream of diode 522*c* and Darlington pair 540*d* is downstream of diode 522*d*. Darlington pairs 540*a*, 540*b*, 540*c*, 540*d* are arranged in series with each other and each are downstream of the diode 522*a*. In an embodiment, the second module can provide shunting redundancy to the first module and vice versa. Thus, if one of the first module or the second module no longer provides adequate shunting, then the other module will shunt current to compensate for the inadequacy. In an embodiment, any of diodes 512*a*, 512*b*, 512*c*, 512*d*, 522*a*, 522*b*, 522*c*, 522*d* is a zener diode including a single zener diode, a plurality of zener diodes, a set being all zener diodes and at least two sets being comprised all of zener diodes.

Referring again to FIG. 2, FIG. 3, FIG. 4 and FIG. 5, in an embodiment, an electrical system 90 comprises a voltage source 110, a shunting component 100, 300, 400, 500 that comprises a first bipolar junction transistor 320, 410, 514*a* having a first base 322, a first collector 324 and a first emitter 326 and a second bipolar junction transistor 330 having a second base 332 receiving the current flow of the first emitter 326, a second collector 334 electrically coupled to the first collector 324 and a second emitter 336, and the load 130 is electrically coupled in parallel with the shunting component 100, 300, 400, 500. In an embodiment, the voltage provided by the voltage source 110 is greater than or equal to 90 kV. In another embodiment, the voltage provided by the voltage source 110 is greater than or equal to 300 kV. In an embodiment, the current driven by the voltage source upstream of the shunting component is between 0.1 amperes and twelve amperes. In an embodiment, the conductance of the power transmission cable from the voltage source to the load has a resistance of 0.0015 ohm/1000 ft or greater. In an embodiment, the conductance of the power transmission cable from the voltage source to the load has a resistance greater than or equal to 0.002 ohm/1000 ft. In an embodiment, the load has a resistance greater than 2 ohms and in another embodiment is within the range of 1 to 12 ohms. In an embodiment, the load has a resistance greater than 2 ohms and in another embodiment is greater than eight ohms. In an embodiment, the load is located greater than fifty miles from the voltage source. In an embodiment, the voltage source is a direct current source. In an embodiment, the voltage provided by the voltage source 110 is greater than or equal to 150 kV DC at or about a constant current. In another embodiment, the voltage provided by the voltage source 110 is greater than or equal to 300 kV DC at or about a constant current.

Still referring to FIG. 2, FIG. 3, FIG. 4 and FIG. 5, in an embodiment, the shunting component 100, 300, 400, 500 includes first bipolar junction transistor 320 and the second bipolar junction transistor 330 that form a first Darlington pair 320 and 330, 410, 514*a*. In an embodiment, the shunting component 100, 400, 500 further includes a second Darlington pair 420, 514*b* which includes a third bipolar junction transistor 422 and a fourth bipolar junction transistor 424, the second Darlington pair 420, 514*b* lying downstream of the first Darlington pair 410, 514*a*. In an embodiment, the shunting component 100, 300, 400, 500 further includes a plurality of Darlington pairs 420, 430, 440, 514*b*, 514*c*, 514*d* each lying downstream of a first Darlington pair 410, 514*a*, respectively. In an embodiment, the shunting component 100, 300, 400, 500 may include a set of diodes 450, 512*a*, 512*b*, 512*c*, 512*d* in series. The diodes may be zener diodes and may be reverse-biased.

Figure 6:
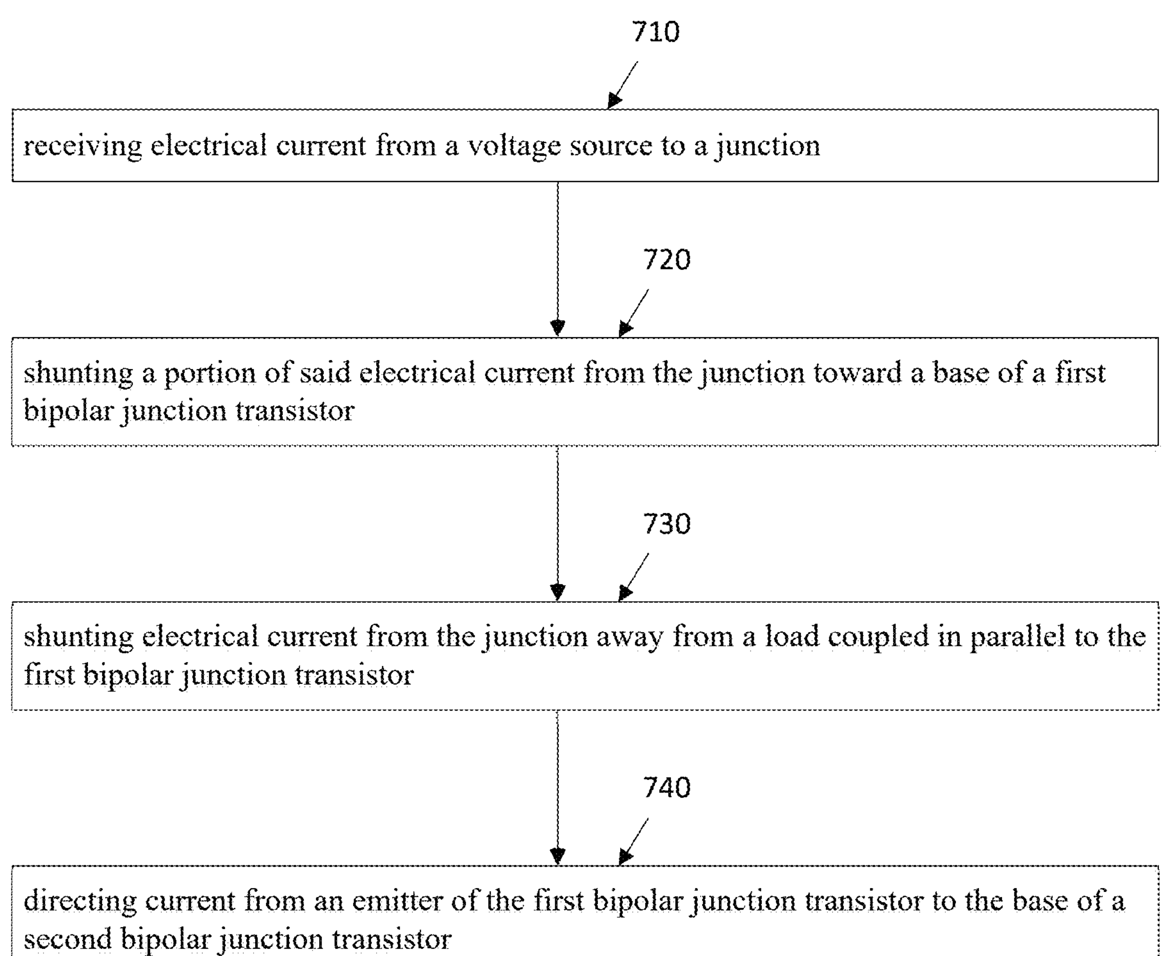
FIG. 6 is a flowchart illustrating steps for shunting current for an electrical component according to another embodiment of the present disclosure.

FIG. 6 illustrates a method of shunting current by an electrical component according to an embodiment of the invention, comprising receiving electrical current from a voltage source to a junction 710, shunting a portion of the electrical current from the junction toward a base of a first bipolar junction transistor 720, shunting electrical current from the junction away from a load coupled in parallel to the first bipolar junction transistor 730, and directing current from an emitter of the first bipolar junction transistor to the base of a second bipolar junction transistor 740. In an embodiment, the method of shunting current in an electrical system, where in the step of shunting electrical current from the junction away from a load, comprises shunting a portion of the electrical current from the junction toward a base of a third bipolar junction transistor. In an embodiment, the method of shunting current in an electrical system comprises directing current from the emitter of the second bipolar junction transistor to the collector of a fourth bipolar transistor and where the base of the fourth bipolar transistor coupled to the emitter of the third bipolar transistor.

In the embodiment illustrated in FIG. 6, the voltage source may provide a direct current and may provide a generally constant current. A further step may comprise directing a constant current from a voltage source to a junction. A further step may comprise receiving electrical current by the collector of the first bipolar junction transistor and the collector of the second bipolar junction transistor from a common junction. A further step may comprise directing current from the emitter of the second bipolar junction transistor to a plurality of Darlington pairs connected in series to the second bipolar junction transistor. A further step may comprise directing current from the voltage source to a load connected in parallel to the first bipolar junction transistor and the second bipolar junction transistor.

In understanding the scope of the present invention, the term "configured" as used herein to describe a component, section or part of a device includes hardware and/or software that is constructed and/or programmed to carry out the desired function. In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Finally, terms of degree such as "substantially", "about", "generally" and "approximately" as used herein mean a reasonable amount of deviation of the modified term such that the end result is not significantly changed.

From the above description, it is manifest that various techniques may be used for implementing the concepts without departing from the scope of the claims. The described embodiments are to be considered in all respects as illustrative and not restrictive. The method/apparatus disclosed herein may be practiced in the absence of any element that is not specifically claimed and/or disclosed herein. It should also be understood that the systems and methods are not limited to the particular embodiments described herein, but is capable of many embodiments without departing from the scope of the claims.

I claim:

1. An electronic component comprising:

a first bipolar junction transistor having a first base, a first collector and a first emitter;

a second bipolar junction transistor having a second base receiving the current flow of said first emitter, a second collector electrically coupled to said first collector and a second emitter, wherein the first bipolar junction transistor and the second bipolar junction transistor form a first Darlington pair;

a load interface for electrically coupling the electronic component in parallel to a load; and a resistance from a transmission line upstream of the second collector.

2. An electronic component comprising:

a first bipolar junction transistor having a first base, a first collector and a first emitter;

a second bipolar junction transistor having a second base receiving the current flow of said first emitter, a second collector electrically coupled to said first collector and a second emitter, wherein the first bipolar junction transistor and the second bipolar junction transistor form a first Darlington pair;

a load interface for electrically coupling the electronic component in parallel to a load; and further including a second Darlington pair which includes a third bipolar junction transistor and a fourth bipolar junction transistor, the second Darlington pair lying downstream of the first Darlington pair.

3. The electronic component of claim 2 further comprising a plurality of Darlington pairs, each lying downstream of the first Darlington pair.

4. An electronic component comprising:

a first bipolar junction transistor having a first base, a first collector and a first emitter;

a second bipolar junction transistor having a second base receiving the current flow of said first emitter, a second collector electrically coupled to said first collector and a second emitter, wherein the first bipolar junction transistor and the second bipolar junction transistor form a first Darlington pair;

a load interface for electrically coupling the electronic component in parallel to a load; and a first set of diodes, the first set comprising a first diode and a plurality of diodes in series with said first diode.

5. The electronic component of claim 4 further comprising a second set of diodes, the second set of diodes comprising a second diode and a plurality of diodes in series with said second diode, the second set of diodes in parallel with the first set of diodes, and a plurality of Darlington pairs coupled in series and downstream of said second diode.

6. An electrical system comprising:

a voltage source;

an electronic component comprising a first bipolar junction transistor having a first base, a first collector and a first emitter and a second bipolar junction transistor having a second base receiving the current flow of said first emitter, a second collector electrically coupled to said first collector and a second emitter, wherein the first bipolar junction transistor and the second bipolar junction transistor form a first Darlington pair;

a load electrically coupled in parallel with said electronic component; and further including a second Darlington pair which includes a third bipolar junction transistor and a fourth bipolar junction transistor, the second Darlington pair lying downstream of the first Darlington pair.

7. The electrical system of claim 6 further comprising a plurality of Darlington pairs, each lying downstream of the first Darlington pair.

8. A method of shunting current in an electrical system comprising:

receiving electrical current from a voltage source to a junction;

shunting a portion of said electrical current from the junction toward a base of a first bipolar junction transistor;

shunting electrical current from the junction away from a load coupled in parallel to the first bipolar junction transistor;

directing current from an emitter of the first bipolar junction transistor to the base of a second bipolar junction transistor, wherein the first bipolar junction transistor and the second bipolar junction transistor form a first Darlington pair; and further comprising shunting a portion of said electrical current from the junction toward a base of a third bipolar junction transistor, wherein the third bipolar junction transistor and a fourth bipolar junction transistor form a second Darlington pair lying downstream of the first Darlington pair.

9. The method of shunting current in an electrical system of claim 8 further comprising directing current from the emitter of the second bipolar junction transistor to the collector of a fourth bipolar transistor, the base of the fourth bipolar transistor coupled to the emitter of the third bipolar transistor.

* * * * *